(12) United States Patent
Schiffmann et al.

(10) Patent No.: US 9,520,521 B2
(45) Date of Patent: Dec. 13, 2016

(54) OPTICALLY ACTIVE COATING FOR IMPROVING THE YIELD OF PHOTOSOLAR CONVERSION

(71) Applicants: LABORATOIRE DE PHYSIQUE DU RAYONNEMENT ET DE LA LUMIÈRE, Paris (FR); CASCADE, Clamart (FR)

(72) Inventors: Marc Schiffmann, Vigneux De Bretagne (FR); François Le Poull, Lannion (FR); Philippe Gravisse, Paris (FR)

(73) Assignees: LABORATOIRE DE PHYSIQUE DU RAYONNEMENT ET DE LA LUMIÈRE, Paris (FR); CASCADE, Clamart (FR)

( * ) Notice: Subject to any disclaimer, the term of this patent is extended or adjusted under 35 U.S.C. 154(b) by 0 days.

(21) Appl. No.: 14/415,053

(22) PCT Filed: Jul. 16, 2013

(86) PCT No.: PCT/FR2013/051707
§ 371 (c)(1),
(2) Date: Jun. 3, 2015

(87) PCT Pub. No.: WO2014/013186
PCT Pub. Date: Jan. 23, 2014

(65) Prior Publication Data
US 2015/0270427 A1  Sep. 24, 2015

(30) Foreign Application Priority Data
Jul. 16, 2012 (FR) ..................... 12 56849

(51) Int. Cl.
*H01L 31/05* (2014.01)
*H01L 31/02* (2006.01)
(Continued)

(52) U.S. Cl.
CPC .......... *H01L 31/055* (2013.01); *C09D 131/04* (2013.01); *C09D 133/12* (2013.01); *H01L 31/02322* (2013.01); *Y02E 10/52* (2013.01)

(58) Field of Classification Search
CPC ............... H01L 31/055; H01L 31/0547; H01L 31/02322; Y02E 10/52; Y02E 10/549; Y02E 10/50; C09D 131/04; C09D 133/12
See application file for complete search history.

(56) References Cited

U.S. PATENT DOCUMENTS 5,078,462 A * 1/1992 Gravisse .............. A01G 9/1438
                                                         359/326
5,134,296 A * 7/1992 Gravisse ................ C09K 11/06
                                                         250/341.8
(Continued)

*Primary Examiner* — Jayne Mershon
*Assistant Examiner* — Mayla Gonzalez Ramos
(74) *Attorney, Agent, or Firm* — Harness, Dickey & Pierce, P.L.C.

(57) ABSTRACT

The invention relates to optically active coatings for improving the yield of photosolar conversion, consisting of a transparent matrix containing a plurality of optically active constituents absorbing the light energy in a first absorption wavelength lambdaA1 and reemitting the energy in a second wavelength lambdaR1 different from lambdaA1, said optically active constituents being selected such that the reemission wavelength lamdaR1 of at least one type of constituent corresponds to the absorption wavelength $lambda_{42}$ of at least one second type of constituent, characterised in that the $C_2/C_1$ ratio of concentration $C_1$ of the optically active constituents of a first type in relation to the concentration $C_2$ of the optically active constituents of said second type is between 0.13 and 0.26; $C_i$ designating the concentration in moles per liter of the constituent i in relation to the doped matrix.

15 Claims, 2 Drawing Sheets

(51) Int. Cl.
*C09D 131/04* (2006.01)
*C09D 133/12* (2006.01)
*H01L 31/055* (2014.01)
*H01L 31/0232* (2014.01)

(56) References Cited

U.S. PATENT DOCUMENTS

| | | | | |
|---|---|---|---|---|
| 5,646,397 | A * | 7/1997 | Wenham | F24J 2/062 |
| | | | | 126/698 |
| 6,570,083 | B2 * | 5/2003 | Gravisse | H01L 31/042 |
| | | | | 136/246 |
| 2010/0186801 | A1 * | 7/2010 | Boehm | B32B 17/10018 |
| | | | | 136/254 |
| 2010/0193011 | A1 * | 8/2010 | Mapel | C03C 3/102 |
| | | | | 136/246 |
| 2012/0132930 | A1 * | 5/2012 | Young | H01L 31/0481 |
| | | | | 257/84 |

* cited by examiner

OPTICALLY ACTIVE COATING FOR IMPROVING THE YIELD OF PHOTOSOLAR CONVERSION

CROSS-REFERENCE TO RELATED APPLICATIONS

This application is a 371 U.S. National Stage of International Application No. PCT/FR2013/051707, filed Jul. 16, 2013, which claims priority to French Patent Application No. 1256849, filed Jul. 16, 2012. The entire disclosures of the above applications are incorporated by reference herein.

FIELD OF THE INVENTION

The present invention relates to the field of photosolar conversion, and specifically to the optimisation of said conversion in order to improve the photoconversion yield of films or plates inserted between the solar radiation and a device such as an agricultural greenhouse, a phytoreactor or a photovoltaic cell. The invention relates specifically to the implementation of an interface doped with optically active components forming a light cascade. "Light cascade" in the sense of the present application is understood to refer to the wavelength transfer occurring by the association of a series of optically active components selected such that the re-emission wavelength of one type of component corresponds to the absorption wavelength of another type of component, each of the types of components being defined by a re-emission wavelength which is different from the absorption wavelength. Said components can be photoluminescent, scintillating, fluorescent, or laser-dye components.

The "light cascade" according to the present patent can also include one or more molecules producing an anti-Stokes shift (the atom of the molecule thus emits a photon with energy equal to the sum of the energy of the photon absorbed and of the phonon. The wavelength of the emitted photon is thus shorter). During the inelastic collision between a molecule and a photon, radiation with a shorter wavelength than that which enabled the excitation is emitted. The Stokes shift is the energy difference between the exciting wavelength and the wavelength of the emitted light, which is longer and thus has less energy. The molecule thus retains an energy surplus which can cause the emission of a longer wavelength than that received (with a second photon). A shift towards shorter wavelengths (thus with higher energy) than the incident light may appear. Such a shift is referred to as anti-Stokes.

BACKGROUND

French patent FR 2792460, which is known in the prior art, describes a photovoltaic generator comprising at least one photovoltaic cell and a transparent matrix deposited with at least one optically active material having an absorption wavelength $lambda_a$ and a re-emission wavelength lambda, the optically active material being selected such that $lambda_a$ corresponds to a range of lower sensitivity of the photovoltaic cell than $lambda_r$, the matrix comprising a reflective coating. The matrix comprises, on the input surface, a dichroic filter substantially reflecting wavelengths of more than around 950 nm, and substantially transparent for wavelengths of less than 950 nm, and on the surface opposite the input surface a reflective coating for wavelengths of more than 400 nm, the photovoltaic cell being included in the transparent matrix.

U.S. Pat. No. 4,088,508, which is known in the prior art, describes an energy amplifying device that can be adapted to a solar cell, including a matrix with fluorescent substances dispersed therein.

U.S. Pat. No. 4,367,367 is also known, describing a collector suitable for concentrating solar energy on a photoelectric cell, including in combination at least one glass plate doped with a substance that is fluorescent when lit by sunlight. A photoelectric cell is attached to a lateral side of the plate, the other lateral sides of the plate being provided with a reflective coating. The cell is highly efficient in the fluorescent radiation wavelength range. A plurality of such glass plates can be stacked upon one another, each doped to absorb at a predetermined region of the spectrum and to fluoresce in a region in which a certain photoelectric cell is sensitive. A fluorescent dye in a suitable substrate can be applied as a surface layer on such glass plates, and this improves the overall efficiency of the collector.

U.S. Pat. No. 4,110,123 describes a photovoltaic cell, in which light is collected in a light concentrator including a transparent layer, the refraction coefficient of which is higher than that of the ambient medium and which contains fluorescent centres and is fed to a solar cell, characterised in that more than one concentrator/solar cell combination is stacked on top of another by means of a medium having a lower refraction coefficient than that of the concentrators, each concentrator being suitable for converting a portion of the incident spectrum into fluorescent light and for supplying same to a solar cell.

U.S. Pat. No. 7,541,537 describes a photovoltaic cell having improved conversion properties. The cell includes a cover for a photovoltaic device. In one embodiment, the cover includes a fluorescent material that shifts the wavelength of one portion of the incident light to be closer to the wavelength that produces the least amount of thermal loading on the photovoltaic device. In another embodiment, the cover comprises a fluorescent material between two reflective filters. The cell and the cover can be placed together in a stack or separated from one another.

The prior art solutions have problems of optical yield. When the matrix contains a plurality of dopants of various natures, the chemical or optical interactions thereof cause an attenuation or an alteration of the transmission in certain cases of high concentrations of dopants, or a loss of efficiency when the concentration of certain dopants is insufficient. An unsuitable concentration may even cause the extinction of certain re-emission phenomena, thus completely modifying the lighting spectrum produced by the doped interface. Furthermore, some of the prior art solutions propose a multi-layer interface formed by a stack of planes, each having a specific type of dopant. The disadvantage of said solutions is that the interactions take place in sequential fashion and do not enable the creation of enough interactions to have any real effect of optimising the lighting spectrum.

SUMMARY

In order to solve the disadvantages of the prior art, the invention relates, in the broadest sense thereof, to an optically active coating for improving the yield of photosolar conversion. Said coating is, by way of example, made up of a transparent matrix containing a plurality of optically active components absorbing light energy in a first absorption wavelength $lambda_{A1}$ and re-emitting the energy in a second wavelength $lambda_{R1}$ which is different from $lambda_{A1}$, said optically active components being selected such that the re-emission wavelength $lambda_{R1}$ of at least one type of component corresponds to the absorption wavelength lambda$_{A2}$ of at least one second type of component, characterised in that the $C_2/C_1$ ratio of concentration $C_1$ of the optically active components of a first type in relation to the concentration $C_2$ of the optically active components of said second type is comprised between 0.4 and 0.6; $C_i$ designating the concentration in moles per liter of the component i in relation to the doped matrix.

The invention relates, in particular, to an optically active coating for improving photosolar yield such as to optimise the yield of a photovoltaic cell, characterised by comprising N types of $OAC_{Stokes}$ components, wherein the re-emission wavelength is shorter than the absorption wavelength, wherein N is equal to 3 or 5, the concentration $C_n$ of the level-N components being also comprised between 0.4N and 0.6N, the matrix also containing an $OAC_{anti\text{-}Stokes}$ component wherein the re-emission wavelength is shorter than the absorption wavelength. The highest type of level-N optically active component preferably has a re-emission wavelength with a peak of between 945 nanometers and 980 nanometers.

According to a first variant, said matrix is made up of a film of ethylene vinyl acetate or polymethyl methacrylate. According to a second variant, said matrix is made up of a methyl methacrylate resin or silicone. According to a third variant, said matrix is made up of a film of polyvinyl chloride. According to another variant, said matrix is made up of a film made up of a copolymer including 80% to 90% low-density polyethylene and 10% to 20% ethylene vinyl acetate. According to another variant, said matrix is made up of polyvinylidene fluoride.

The invention also relates to a photovoltaic module characterised by including at least one photovoltaic element associated with an optically active coating that is consistent with one of the aforementioned coatings. Said module advantageously also includes $OAC_{anti\text{-}Stokes}$ components wherein the re-emission wavelength, comprised between 550 and 800 nanometers, is shorter than the absorption wavelength, comprised between 1000 and 1500 nanometers. Advantageously, the module includes a reflecting rear surface, the photovoltaic element being encapsulated in an optically doped matrix such as to form said coating.

According to a specific variant, the module according to the invention includes a plurality of photovoltaic elements forming a matrix with an expansion of 0.25 to 0.75, the areas comprised between said photovoltaic elements being transparent. According to another variant, the matrix encapsulating the photovoltaic elements includes persistent compounds which make it possible to release light in the lack of solar exposure.

The invention also relates to optically active granules for the production of coatings, in particular to films in accordance with the invention, characterised by being made up of a transparent matrix containing a plurality of optically active components absorbing light energy in a first absorption wavelength lambda$_{A1}$ and re-emitting the energy in a second wavelength lambda$_{R1}$ which is longer than lambda$_{A1}$, said optically active components being selected such that the re-emission wavelength lambda$_{R1}$ of at least one type of component corresponds to the absorption wavelength lambda$_{A2}$ of at least one second type of component, characterised in that the $C_2/C_1$ ratio of concentration $C_1$ of the optically active components of a first type in relation to the concentration $C_2$ of the optically active components of said second type is comprised between 0.1 and 0.2; $C_i$ designating the concentration in moles per liter of the component I in relation to the doped matrix. The granules are advantageously produced from doped polymers with high EVA content or polyvinyl chloride (PVC) or even from polyvinylidene fluoride.

BRIEF DESCRIPTION OF THE DRAWINGS

The invention will be better understood from reading the following description, made in reference to the appended drawings, wherein.

DETAILED DESCRIPTION

Figure 1:
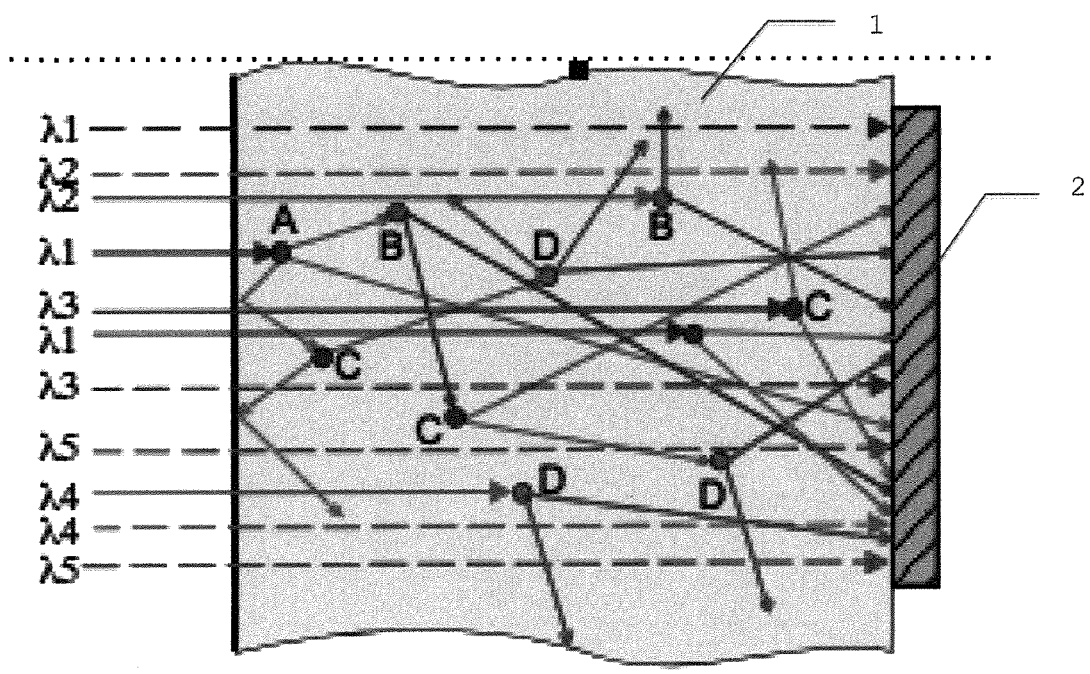
FIG. 1 is a section view of a doped matrix according to the invention.
Figure 2:
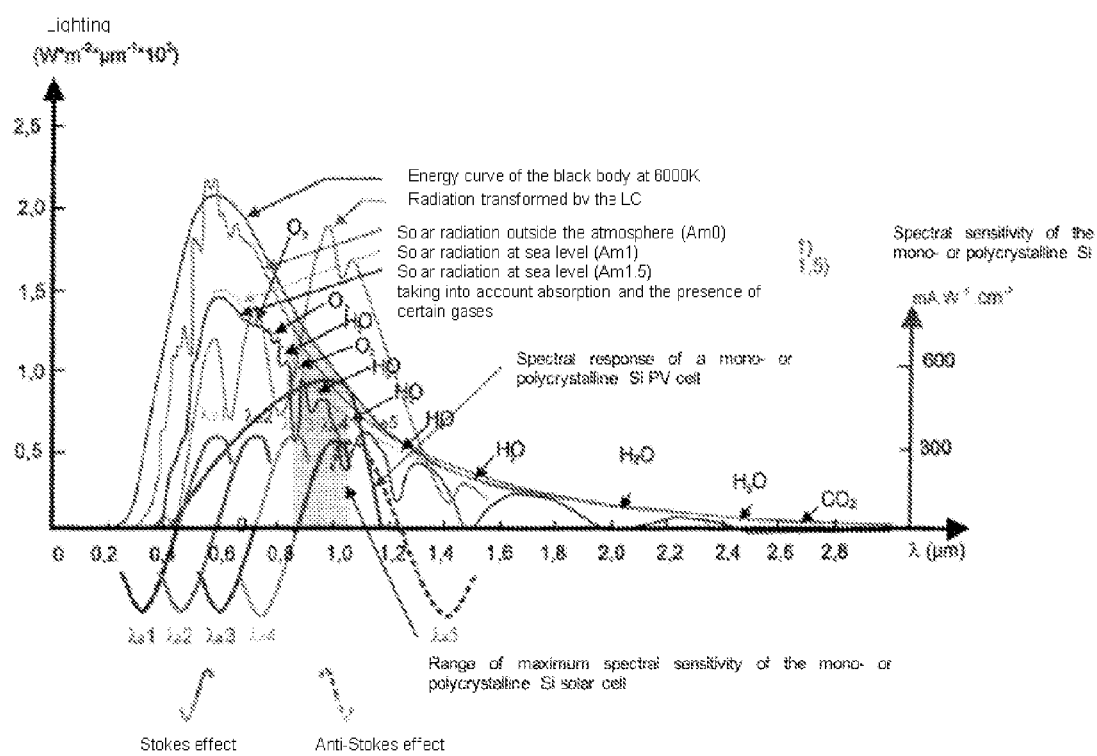
FIG. 2 is a diagrammatic view of the incident and output spectrum of a doped material according to the invention.

FIG. 1 is a section view of a doped interface according to the invention. Said interface is made up of a transparent matrix containing optically active components with references A to D. In the described example of application, the interface is applied to the surface of a photovoltaic cell (2) of a known type. The matrix is made up of a rigid or flexible organic material, or else is in the form of a coating which can be applied in the form of a resin.

The organic material is selected, in particular, from:
polymethyl methacrylate (PMMA)
ethylene vinyl acetate (EVA)
polyvinyl chloride (PVC)
polycarbonate (PC)
methyl methacrylate (MMA)
low-density polyethylene (LDPE)
a methyl methacrylate resin or silicone
polyvinylidene fluoride (PVDF).

The optically active dopants are selected from:
organic luminophores (Stokes effect)
inorganic luminophores (anti-Stokes and persistent effect)
optically active molecules such as scintillating organic crystals with N+1, N+2, N+3, N+x anthracene $\phi$ rings, perylene or derivatives, pentacene, or organic luminophores such as diphenyl, carbazol stilbene or derivatives, selected such that the emission spectra of some correspond to the absorption spectra of the other.

This has the purpose of producing the expected electromagnetic frequency shift from the UV and visible spectra to the near infrared in order to mobilise in the range of greatest sensitivity of the silicon photovoltaic cell, for example, the maximum light energy possible, the maximum photons of $\lambda$ comprised between 620 and 990 nm corresponding to an energy near the gap of an n-p c.Si cell, for example. Perylene is a chemical compound of formula $C_{20}H_{12}$ or $C_{32}H_{16}$, for example. This is an aromatic hydrocarbon presented as a brown solid.

Perylene emits blue or red fluorescence, and thus can be used as a blue or red dopant for organic LEDs, optionally substituted. It is also an organic photoconductor. It has maximum absorption at 434 nm with a molar extinction coefficient of 38,500 M-lcm-l at 435.75 nm, and has low solubility in water (1.2×10-5 mmol/l), like all the other polycyclic aromatic compounds.

All the carbon atoms of perylene are $sp^2$ hybridised, which explains why the central cycle is not shown as a fifth benzene ring (since then two carbon atoms would be sp hybridised and the molecule would lose a portion of the aromatic character and the fluorescent properties thereof). The structure of perylene has been intensively studied by X-ray diffractometry.

Pentacene is a chemical compound of formula $C_{22}H_{14}$ belonging to the polycyclic aromatic hydrocarbon (PAH) family and formed by five benzene rings fused in line. The extended conjugated structure and the crystalline structure thereof mean that pentacene is a good p-type organic semiconductor (electron donor). It forms excitons therein by absorption of ultraviolet or visible radiation, making it highly sensitive to oxidation: this is the reason why, although it has the appearance of a red powder when it has just been synthesised, it gradually turns green when exposed to open air and light.

Pentacene is a promising material for the production of thin-film transistors and of organic field-effect transistors. The holes therein have a mobility of 5.5 cm2.V-1.s-1, which is close to the level of amorphous silicon. It forms p-n junctions with fullerene C60, which are used to manufacture organic photovoltaic cells.

For the component of the highest level N: 5,12-bis(phenylethynyl)naphthacene, also abbreviated as BPEN, is a polycyclic aromatic hydrocarbon of formula $C_{34}H_{20}$ used as a fluorochrome for chemiluminescent tubes; it emits an orange light. This is an n-type organic semiconductor.

The aim of the system according to the invention is to mobilise, in a silicon solar cell, for example, which is mainly sensitive to light radiation comprised between 700 and 950 nm, an incident energy greater than that normally provided by solar light in said wavelength band. In principle, the solar energy used is defined by the overlap area of the emission spectrum of solar light and the absorption spectrum of the solar cell. Considering the specificity of the cell (absorption of energy photons corresponding to wavelengths of 700 to 950 nm) and given that the energy recovered by the solar cell is a function of solar irradiance—i.e. the number of photons transported—one of the means for increasing the yield of the cell is to make usable the photons of the portion of the solar spectrum located below 700 nm, from UV to the visible spectrum).

The used method transforms high-frequency photons (250 to 700 nm) into low-frequency photons (700 to 950 nm) using the fluorescent properties of certain chemical compounds taken as intermediaries in the transport of energy from sunlight. The substances are selected such that their absorption spectra constitute consecutive zones, making it possible to cover the entire solar spectrum in the area (250-700 nm) (overlapping frequencies or wavelengths). Light radiation with a predetermined wavelength $\lambda p$ can be absorbed by the substance in which the absorption spectrum includes said value of $\lambda$. The photons h v n or hc/$\lambda$n which made it possible to excite the molecules of said substance (absorption phenomenon) are thus ultimately extracted from the incident beam. However, the unstable state which was conferred to the molecules has a very short duration. The return to the ground state (stable state of the molecules at a given temperature) can be carried out in part (statistical expression of the phenomenon) and, advantageously in the present case, by radiative emission (fluorescence/phosphorescence). The photons thus generated are found to correspond to the spectrum of absorption of another substance which will take over from same. It should be noted that a given substance can absorb either the emission of the substance that precedes same in the sequence of products used (transformed energy), or the portion of the emission of the solar spectrum that corresponds to same (non-transformed energy).

In the cell, the total usable energy can be expressed as:

$$E_{tot} = E_{NT} + \Sigma E_T$$

Wherein:
$E_{NT}$: Non-transformed energy (700-800 nm zone of the solar spectrum)
$\Sigma_{ET}$: E of the transformation energies $$\Sigma ET = E_{A_1B_1C_1D} + E_{C_1D} + E_D$$

Wherein:
$A_1B_1C_1$ and D: Substances in which the respective spectra share the solar spectrum in the rising direction of wavelengths
$E_{A_1B_1C_1D}$: Energy which has gone through all the stages of transformation
Ed: Energy from the transformation of radiation in the visible domain from the solar source located directly below the area of sensitivity of the solar cell via the single substance D.

The chemical compounds are trapped in a suitable matrix. The matrix should be applied to the cell such as to constitute a photon transformer which is inserted between the cell and the light source. The various types of chemical compounds are homogeneously dispersed in the matrix.

Since the emission of chemical intermediaries takes place in every direction, the emission of A (for example) is picked up by molecules B located either between A and the cell, or between A and the source (and so on). The low-frequency photons ultimately produced by time unit are directed half towards the cell and half in the opposite direction (the photons emitted in a plane parallel to the cell being negligible). The chemical substances used have high quantum efficiency of fluorescence (or phosphorescence) and should not result in photochemical processes that are likely to alter the nature (and thus the yield) of the photon transformer.

For example, the following table shows various examples of formulas and of the composition thereof and the concentration of optically active components in a PMMA plate with a thickness of three millimeters (in g/kg and in mole/liter):

TABLE 1

| | Compounds | | | | | |
|---|---|---|---|---|---|---|
| Reference | PPO 2,5diphenyl Oxazole C15H11NO | Uvitex OB 2,5thiophene C26H26N2O2S | 3G Hostasol Naphthalimide | L V 850 Perylene Tetra. carboxy. C24H8O2 | L F R 305// OR 610 DiPerylene C32H16 | GG Hostasol Red C23H12OS |
| Formula 1 | 0.44 g<br>1.52 * 10−3<br>mole/litre | 0.11 g<br>1.95 * 10−4<br>mole/litre | | | | 0.06 g<br>1.35 * 10−5<br>mole/litre |
| Formula 2 | 0.44 g<br>1.52 * 10−3<br>mole/litre | 0.11 g<br>1.95 * 10−4<br>mole/litre | 0.06 g<br>1.31 * 10−4<br>mole/litre | | | 0.006 g<br>9.28 * 10−6<br>mole/litre |

TABLE 1-continued

| Reference | PPO 2,5diphenyl Oxazole C15H11NO | Uvitex OB 2,5thiophene C26H26N2O2S | 3G Hostasol Naphthalimide | L V 850 Perylene Tetra. carboxy. C24H8O2 | L F R 305// OR 610 DiPerylene C32H16 | GG Hostasol Red C23H12OS |
|---|---|---|---|---|---|---|
| Formula 3 | 0.22 g<br>1.11 * 10−3 mole/litre | 0.11g<br>2.86 * 10−4 mole/litre | | 0.06 g<br>1.71 * 10−4 mole/litre | 0.03 g<br>8.34 * 10−5 mole/litre | |
| Formula 4 | 0.22 g<br>1.32 * 10−3 mole/litre | 0.11 g<br>3.40 * 10−4 mole/litre | | | 0.022395 g<br>8.0 * 10−5 mole/litre | |
| Formula 5 | 0.22 g<br>1.11 * 10−3 mole/litre | 0.11 g<br>2.86 * 10−4 mole/litre | | | 0.03 g<br>8.34 * 10−5 mole/litre | |

The following table shows various examples of formulas and of the composition thereof and the concentration of optically active components in an EVA encapsulation film with a thickness of $e=90$ μm (in g/kg and in mole/liter):

TABLE 2

| Reference | PRO 2,5diphenyl Oxazole C15H11NO | Uvitex OB 2,5thiophene C26H26N2O2S | 3G Hostasol Naphthalimide | L V 850 Perylene Tetra. carboxy. C24H8O2 | L F R 305// OR 610 diPerylene C32H16 | RH800 C26H26N3O5 | Styryl 20 C33H37O3SCl |
|---|---|---|---|---|---|---|---|
| Formula 6 | 0.88 g<br>1.66 * 10−3 mole/litre | 0.22 g<br>2.14 * 10−4 Mole/litre | | | | | |
| Formula 7 | 0.31 g<br>1.32 * 10−3 mole/litre | 0.16 g<br>3.49 * 10−4 mole/litre | | | 0.03 g<br>7.04 * 10−5 mole/litre | | |
| Formula 8 | 0.88 g<br>1.66 * 10−3 mole/litre | 0.22 g<br>2.14 * 10−4 mole/litre | | | 0.025 g<br>2.61 * 10−5 mole/litre | 0.00025 g<br>2.09 * 10−7 mole/litre | |
| Formula 9 | 0.88 g<br>1.66 * 10−3 mole/litre | 0.22 g<br>2.14 * 10−4 mole/litre | | | 0.025 g<br>2.61 * 10−5 mole/litre | | 0.00025 g<br>1.75 * 10−7 mole/litre |

In the examples shown above, the optically active granules with a diameter of 1 to 2 mm are made up of optically active molecules (OAMs) directly integrated into the various polymers such as PMMA, EVA, PVC and PE. Said granules can be used to produce coatings, films with light cascade movement (LC) for the various agricultural and photovoltaic applications. And yet, some of the materials degrade and lose their optoelectronic features, for example light cascades following the actions of photo-oxidation, hydrolysation and migrations of the OAMs. Said phenomenon appears in some of the polymer matrices such as the PE/EVA or EVA polyolefins used specifically for the production of agricultural films or the encapsulation of PV cells.

In order to reinforce the light fastness of the light cascade (LC) doped matrices, the OAMs are included in a medium that is compatible with same, such as PMMA, in which the OAMs/LC have constant optoelectronic characteristics. The LC-doped PMMA is micronised or powdered by a cryomilling technique and reduced to a size of several tens of micrometers in order to be used as a stable organic pigment containing all or part of the useful OAMs.

Said PMMA matrix is mixed into the EVA granules when extruding the film. The formula 2013E is then given as an example. The concentration rate of the powdered doped PMMA is 10%. The doped PMMA powder has a particle size of 2 micrometers and the concentration of dopants is of 5 g/Kg of LC PMMA premix. For 5 kg of OMMA-doped OMMA compound, 25 g of dopants distributed as follows:
PPO: 0.44, or 73.6% by weight of the doping formula
OB: 0.11, or 18.3% by weight of the doping formula
GG: 0.0479, or 8.1% by weight of the doping formula.

For the production of photovoltaic modules, the matrix located under the cells on the surface opposite the photon-collection surface, can advantageously be made of ethyl vinyl acetate, for example, encapsulating the photovoltaic elements (cells) and made reflective by inclusion of TiOx pigments. Likewise, the matrix located under the cells and encapsulating the photovoltaic elements can be made simultaneously reflective and persistent according to one embodiment, by the inclusion (doping) of persistent compounds such as Cu-doped ZnS inorganic crystals, for example, making it possible to release light under absolute darkness during a long time—more than one hour, for example—after interrupting the incident electromagnetic energy (light excitation). Likewise, the matrix located under the cells encapsulating the photovoltaic elements can also be made anti-Stokes by the inclusion of crystalline particles such as rare-earth oxysulphides Green UC2 from Riedel-de Haën or YF3YbEr from RP.

Moreover, the rear substrate (or backsheet) of the photovoltaic module can be made up of a polyfluorinated polymer such as polyvinylidene fluoride (PVDF) doped as the encapsulation matrix located under the cells with TiO2 and/or ZnS:Cu and/or Green UC2 rare-earth oxysulphide in order to grant same the additional functions of reflectance and/or persistence and/or anti-Stokes in wavelength bands that complement those of the encapsulation matrices of the Stokes light-cascade doped front surface. In addition, diffusing matrices increase the efficiency and the yield of the light cascades. Preferably, the light cascades are associated with diffusing loads, $SiO_2$, $SiO_3$, aluminosilicate zeolite, mesoporous silicon. It should be noted that EVA films are also interesting for the intrinsic diffusion coefficient thereof. Mesoporous materials have a contact surface of the order of 1000 $m^2/g/cm^{-1}$ and are good candidates for grafting optically active molecules (OAM)/light cascades (LC), the light fastness and the physical-chemical inertia thereof. The formulas RREFLEC 2010 A', B' and C' in table 3 are part of this technique.

On the front surface, a LC with OAMs of fluorophores with persistence of less than $10^{-8}$ seconds is provided, while on the rear surface, mixed LCs of OAMs and OACs (optically active crystals) with photoluminescence of more than than $10^{-8}$ seconds are provided. Certain OACs can thus re-emit by reflection blue photons of 450 nanometers by photoluminescence after excitation.

The following is taken as an example of the joint use of two complementary light cascades: Formula 2013E on the front surface and formula RREFLEC 2010 B' from table 3 on the rear surface. The efficiency of this film/encapsulation plate pair is even greater than the expansion of the photovoltaic cells (PV) in which, by module, the yield is lower than 0.9, since the former actually makes the entire surface of the module optoelectronically active, even the areas not covered with PV cells. In the LC-doped films/plates, the action of diffusing elements such as TiO2, SiO2, ultrafine or pyrogenated silicon, associated with the LCs is interesting in that they are transparent in the visible spectrum and take into account the photons re-emitted by the OAMs in 4Pi steradian in order to increase the useful path in the doped matrix.

In addition, the inorganic structure of the pyrogenated silicon in which the developed surface is of the order of 250 to 400 $m^2/g$ is a structure which is favourable for the grafting of OAMs and for the integration thereof. Thus, a photovoltaic module is obtained in which the optical characteristics of absorption, emission, reflection and persistence of the encapsulation materials that make up same complement one another and work together to improve the photoelectric gains of the cells and to improve the yields of the photovoltaic module.

C-Optically Active Rear Reflector

Doping of the EVA Film Under the Cells:

Optically active reflector in g/kg, thickness 450 μm of EVA and/or doping of the PVDF substrate (PolyVinylidene Fluoride backsheet).

TABLE 3

|  | PPPO | OOB | Lumilux white flow | 22205 ZnS Persistent Exc. UV em. 450 nm | 22330 ZnS Persistent Exc. UV em: 550 nm | Anti-Stokes Oxisulphide IR UC3 Lumilux exc. 1500 nm emi. 550 nm | TtiOx < 0.6 μm Diffusing Nanoparticlees Blc + SiO2 UF. |
|---|---|---|---|---|---|---|---|
| RREFLEC 2010 A | 00.75 | 00.375 |  |  |  |  |  |
| RREFLEC 2010 B | 00.75 | 00.375 | 11 |  |  |  | 22 |
| RREFLEC 2010 C | 00.75 | 00.375 |  |  |  |  | 22 |
| RREFLEC 2012 ARm/A | 00.75 | 00.375 |  |  | 22 | 22 |  |
| RREFLEC 2012 BRm/D | 00.75 | 00.375 |  |  | 22 |  | 22 |
| RREFLEC 2010 A' | 1 | 0.5 |  |  |  |  |  |
| RREFLEC 2010 B' | 1 | 0.5 | 1 |  |  |  |  |
| RREFLEC 2010 C' | 1 | 0.5 |  | 1 |  |  |  |

For use in agricultural films, a stratification architecture with multiple layers is produced. The specialised optical treatments have complementary absorption and re-emission wavelengths from one layer to the other.

Thus, from a complete light cascade with 4 levels of rough UV or IR, the outer layer facing the sun is doped from UV to blue and the inner layer is doped to emit in the band from 600 to 700 nanometers. The outer layer is specifically dedicated to the first frequency shift, which also plays the role of UV protection.

Said technique is novel due to the technique of simultaneous coextrusion of films of different qualities by the same machine. It adapts to coextruded agricultural films made up of a 600-700 nanometer doped central ring which is additionally thermally treated or diffusing and the active outer layer of 400 to 500 nanometers which is additionally treated with antioxidants or hydrophobic. The choices of films are adapted to find conjugated or complementary optoelectronic effects which are favourable for the growth of plants and/or for the optical functions of pollinating insects.

The formulas below are adapted to the use of agricultural films for market garden plants, with a central ring and outer layer. The LC materials are made up of two specialised layers for growing tomatoes and cucumbers. The central ring is an 80-micrometer film, while the outer layer is of 60 micrometers. The film used is made of 4TT.

A complete series of formulas will be used to dope the 80 μm central ring of the film (formulas P012 to P0015), in said films the metering of the OB has been divided by 2 (formula P012) and by 4 (formula P013) in order to reduce or even eliminate the disrupting effects that doping has on pollinating insects. For the partial formulas, the central ring will be doped either with GG (formula P017) or with LRF3O5 (formula P018); the formula P016 is doping with a mixture of GG/LRF305.

For market gardening (tomatoes, peppers) 80μ central ring

|        | PPO | OB    | 2205 | P22 | GG  | F305 | OR610 |
|--------|-----|-------|------|-----|-----|------|-------|
| P012 80μ | 0.4 | 0.05  |      |     | 0.1 | 0.1  |       |
| P013 80μ | 0.4 | 0.025 |      |     | 0.1 | 0.1  |       |
| P014 80μ | 0.3 | 0.05  |      |     |     | 0.1  |       |
| P015 80μ | 0.3 | 0.05  |      |     | 0.1 |      |       |
| P016 80μ |     |       |      |     | 0.1 | 0.1  |       |
| P017 80μ |     |       |      |     | 0.1 |      |       |
| P018 80μ |     |       |      |     |     | 0.1  |       |

For the outer layer of the partially doped films, the dosing of the completely doped films for the PPO and the OB of formulas P0012 and P013 is used again, but with concentrations taken to values that correspond to films of 60 μm.

For market gardening (tomatoes, peppers) 60 μm outer layer

|        | PPO   | OB    | 2205 | P22 | GG | F305 | OR610 |
|--------|-------|-------|------|-----|----|------|-------|
| P019 60μ | 0.533 | 0.066 |      |     |    |      |       |
| P020 60μ | 0.533 | 0.033 |      |     |    |      |       |

The rule of varying the concentration of OAMs is a function of the thickness of the films or plates of LC-doped materials. The notion developed herein is that of the active population of OAMs/OACs per unit of surface/per number of incident photons. The Beer-Lambert law applies here for adjusting the concentration of useful OAMs/OACs. This law is directly linked to the physical parameters; it is independent of the number of incident photons, which is another of the parameter of OPTO LC "smart" materials.

According to the Beer Lambert law:

$$D = \log(l_0/l) = \Sigma * c * d$$

Wherein:
D: Optical density
Σ: Molar extinction coefficient
c: Molar concentration
d: Path length
$l_0$: Light intensity at the input
l: Light intensity at the output
Absorption Efficiency $$Si(l_0/l) = (100/10)(\sim 90\% \text{ absorption} \rightarrow \log(100/10) = \log 10 = 1)$$

$$Si(l_0/l) = (100/1)(\sim 99\% \text{ absorption} \rightarrow \log(100/1) = \log 100 = 2)$$

$$D1 = 1 = \Sigma\, c_1\, d_1$$

$$D2 = 2 = \Sigma\, c_2\, d_2$$

Only depending on the substance at a given wavelength=Cst, from which in order to pass from 10% to 1% it suffices to have $(c_1 d_1)/(c_2 d_2) = 2$ Either, for example, to double the concentration for a constant thickness or to double the thickness with a constant concentration.

If the coefficient Σ is uniform throughout the spectral domain (200 nm-700 nm), the concentration must be around $2*10^{-3}$ moles/liter. Said conditions are ideal for a given substance in the following case:
Diluted solution
99% absorption (absorption efficiency)

A diluted solution must have good conditions in order for the absorption thereof not to be disrupted by molecular associations.

When there are n substances to be mixed: it is necessary to multiply d by n (thickness of the matrix) in order to have an ideal concentration.

For example:

n=4

$d = 4 * 0.1$ d=0.4

The other concentration rule to be highlighted is that of the relative number of OAM1/OAM2/OAM3/OAM4/OAM n-1 in relation to one another. Said concentration varies from one molecule to another in accordance with the molecular weight thereof. To repeat the model of the initial sequence of the benzene PAH OAMs, the concentrations thereof vary from 10-3, 10-4, 10-5, etc. In accordance with the molecular weight of each OAM, or with the number of aromatic rings thereof: anthracene 3 phi (10-3), naphthacene 4 phi (10-4), pentacene 5 phi (10-5), etc.

The invention claimed is:

1. An optically active coating for improving a yield of photosolar conversion, comprising:
a transparent matrix including a plurality of optically active components absorbing light energy in a first absorption wavelength $\text{lambda}_{A1}$ and re-emitting the energy in a second wavelength $\text{lambda}_{R1}$ which is different from $\text{lambda}_{A1}$;
the optically active components being selected such that the re-emission wavelength $\text{lambda}_{R1}$ of at least one type of component corresponds to the absorption wavelength $\text{lambda}_{R2}$ of at least one second type of component, a $C_2/C_1$ ratio of concentration $C_1$ of the optically active components of the first type in relation to the concentration $C_2$ of the optically active components of the second type is comprised between 0.13 and 0.26, $C_i$ designating the concentration in moles per liter of the component i in relation to a doped matrix; and
optically active molecules included in a micronised and/or powdered matrix of light-cascade doped PMMA, and then mixed into EVA granules.

2. The optically active coating according to claim 1, wherein the $C_2/C_1$ ratio of concentration $C_1$ of the optically active components of the first type in relation to the concentration $C_2$ of the optically active components of the second type is comprised between 0.13 and 0.26, $C_i$ designating the concentration in moles per liter of the component i in relation to the doped matrix, the matrix is made up of an organic material selected among an ethylene vinyl acetate film, a polyvinyl chloride film and a film made up of a copolymer including 80% to 90% of low-density polyethylene and 10% to 20% of ethylene vinyl acetate.

3. The optically active coating according to claim 1, further comprising N types of Stokes components referred to by an abbreviation $OAC_{Stokes}$ wherein the re-emission wavelength is longer than the absorption wavelength, wherein N is equal to 3 or 5, the concentration $C_n$ of the level-N components being also comprised between 0.4N and 0.6N, the matrix also containing an anti-Stokes component referred to by an abbreviation $OAC_{anti-Stokes}$, and wherein the re-emission wavelength is shorter than the absorption wavelength.

4. The optically active coating according to claim 1, wherein the type of level-N optically active components has a re-emission wavelength in which the peak is located between 945 nanometres and 980 nanometres.

5. The optically active coating improving the photosolar yield according to claim 1, wherein the matrix includes a film of ethylene vinyl acetate or polymethyl methacrylate.

6. The optically active coating improving the photosolar yield according to claim 1, wherein the matrix includes a methyl methacrylate resin or silicone.

7. The optically active coating improving the photosolar yield according to claim 1, the matrix includes a film of polyvinyl chloride or by a film made up of a copolymer including 80% to 90% low-density polyethylene and 10% to 20% ethylene vinyl acetate.

8. The optically active coating according to claim 1, further comprising $OAC_{anti\text{-}Stokes}$ components wherein the re-emission wavelength, comprised between 550 and 800 nanometres, is shorter than the absorption wavelength, comprised between 1000 and 1500 nanometres.

9. The optically active coating according to claim 1, further comprising a reflective rear surface, the photovoltaic element being encapsulated in a matrix optically doped with a light cascade such as to form the coating.

10. The optically active coating according to claim 1, further comprising a plurality of photovoltaic elements forming a matrix with an expansion of 0.25 to 0.75, and areas between the photovoltaic elements being transparent.

11. The optically active coating according to claim 9, wherein the matrix encapsulating the photovoltaic elements includes persistent compounds which make it possible to release light in a lack of solar exposure.

12. The optically active coating according to claim 1, further comprising a film and/or an encapsulation plate pair including light cascades with OAMs arranged on a front surface, and mixed OAM and OAC LCs arranged on a rear surface.

13. Agricultural film manufactured according to claim 1, wherein the acgricultural films of different qualities and/or various thicknesses are co-extruded simultaneously by a same machine.

14. The optically active coating according to claim 1, wherein the concentration is a function of a thickness of the doped matrix.

15. The optically active coating according to claim 1, wherein the concentration is a function of molecular weight which is a function of a number of polycyclic rings.

* * * * *